United States Patent [19]
Medan et al.

[11] Patent Number: 5,387,910
[45] Date of Patent: Feb. 7, 1995

[54] SIGNAL PROCESSOR

[75] Inventors: Yoav Medan, Haifa; Uzi Shvadron, Mitzpe Aviv, both of Israel

[73] Assignee: International Business Machines Corporation, Armonk, N.Y.

[21] Appl. No.: 1,481

[22] Filed: Jan. 7, 1993

[30] Foreign Application Priority Data

Jan. 8, 1992 [GB] United Kingdom ............... 92300146

[51] Int. Cl.⁶ ............................................ H03M 1/66
[52] U.S. Cl. ...................................... 341/61; 341/144
[58] Field of Search ................ 341/61, 110, 155, 144, 341/122, 123

[56] References Cited

U.S. PATENT DOCUMENTS 4,716,472  12/1987  McNally .................................. 360/8

*Primary Examiner*—Brian K. Young
*Attorney, Agent, or Firm*—Paul S. Drake

[57] ABSTRACT

A signal processor is described for sampling rate conversion of a digitally sampled analog signal, the signal processor including an apparatus for generating an output sampled value for each output sampling instant, the output sampled value being equal to the input sampled value at the last input sampling instant if an input sampling instant has not occurred since the last output sampling instant and being calculated as an interpolation of input values at successive input sampling instants if an input sampling instant has occurred since the last output sampling instant. A virtual, analytic A/D-D/A conversion is employed using digital processing to convert from a given sampling rate to an arbitrary desired rate.

20 Claims, 4 Drawing Sheets

SIGNAL PROCESSOR

TECHNICAL FIELD

The invention relates to signal processors for sampling rate conversion of digitally sampled analog signals.

BACKGROUND ART

In digital signal processing it is sometimes necessary to convert data sampled at one rate to an arbitrary higher sampling rate. For example, speech data sampled at the standard 8 KHz sampling rate might have to be converted to the 44.1 KHz CD rate in order to be saved on a compact disc. It is important, in such a rate conversion process, to preserve the fidelity of the original analog waveform.

Prior art techniques can be classified into two main categories, digital interpolation techniques and analog interpolation techniques.

Digital interpolation techniques operate on the digital stream of samples to yield a new sequence with the desired number of samples in a given time unit. Signal fidelity is controlled by the shape and size of the digital interpolation filter applied to the modified source sequence. Due to the discrete nature of the approach, it is viable only if the source and destination rates exhibit either an integer ratio or a rational ratio M/N with 'small' values of M and N. For large M and/or N these techniques suffer from excessive memory and computational requirements. Also, if either the source or the destination rates M and N deviate from their nominal values, as can happen in cases where the respective clocking systems are independent, these techniques fail to provide synchronous operation.

In analog interpolation techniques the sampled data is converted to an analog signal via a D/A (digital to analog) device and an associated anti-alias filter and then resampled by an A/D (analog to digital) device at the desired destination rate. The main advantage of this scheme is the flexibility of converting the source stream to any desired rate. The main disadvantage is that the analog electronics introduce distortion and noise and thus adversely affect signal fidelity.

DISCLOSURE OF THE INVENTION

According to the invention there is provided a signal processor for sampling rate conversion of a digitally sampled analog signal from an input signal including input values representing the analog signal sampled at input sampling instants to an output signal representing the analog signal sampled at output sampling instants, the signal processor including apparatus for generating an output sampled value for each output sampling instant, the output sampled value being equal to the input sampled value at the last input sampling instant if an input sampling instant has not occurred since the last output sampling instant and being calculated as an interpolation of input values at successive input sampling instants if an input sampling instant has occurred since the last output sampling instant.

The invention provides a hybrid technique which combines the benefits of both prior art approaches while alleviating their respective drawbacks. According to the invention a D/A-A/D conversion is realized in an analytic form using digital processing. Hence, the flexibility of supporting an unlimited range of source and destination rates is maintained while avoiding the distortion and noise associated with true analog conversion. In addition, the cost and complexity associated with providing physical D/A and A/D components is saved.

In a preferred form of the invention this virtual, analytic D/A-A/D conversion process is supplemented by a conventional digital interpolation filter in order to suppress spectral components outside the frequency range of interest and further ensure the fidelity of the signal.

The analog signal can be an audio signal and the signal processor can be in the form of a audio capture and playback adapter for use with a general purpose computer workstation.

Another aspect of the invention provides a method for conversion of a digitally sampled analog signal from an input signal including input values representing the analog signal sampled at input sampling instants to an output signal representing the analog signal sampled at output sampling instants, the method comprising generating, for each output sampling instant, an output sampled value, the output sampled value being equal to the input sampling value at the last input sampling instant, if an input sampling instant has not occurred since the last output sampling instant and being calculated as an interpolation of input values at successive input sampling instants if an input sampling instant has occurred since the last output sampling instant.

There is also provided a method for sampling rate conversion of a digitally sampled analog signal from an input sampling rate to an output sampling rate, the method including converting the signal to an intermediate sampling rate using a method as set out above, the intermediate sampling rate being an integer multiple of the output sampling rate; and converting the signal sampled at the intermediate sampling rate to the output sampling rate. Such a method is advantageous if the output sampling rate is not much greater than the input sampling rate.

An embodiment of the invention will now be described, by way of example, with reference to the accompanying drawing.

BEST MODE FOR CARRYING OUT THE INVENTION

Figure 1:
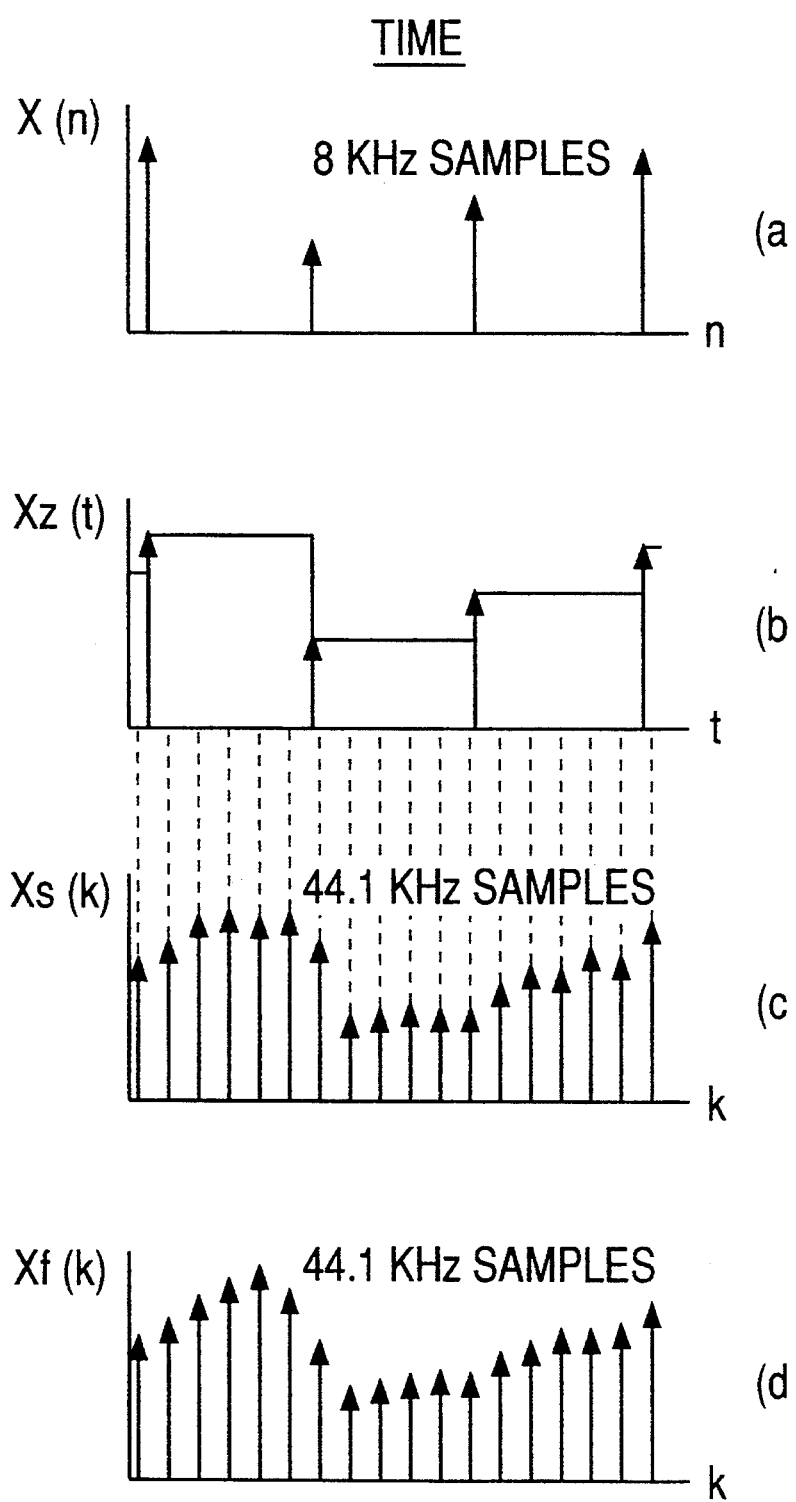
FIG. 1 illustrates the sampling rate conversion process of the present invention in the time domain.
Figure 2:
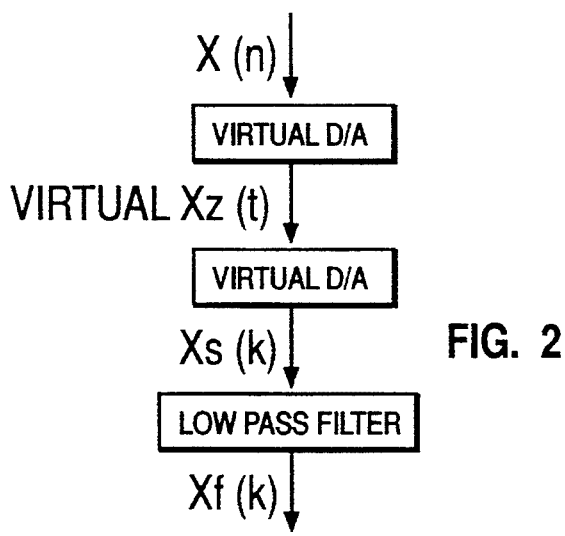
FIG. 2 is a schematic diagram broadly outlining the steps of the sampling rate conversion process.

Referring to FIG. 1, the invention provides for the sampling rate conversion of an input signal $x(n)$ to an output signal $x_f(k)$ using a virtual D/A-A/D process. The signal at the output of a virtual D/A is generated from the input sequence $x(n)$ shown in FIG. 1a using a Zero-Order-Hold (ZOH) kernel. This results in the continuous staircase function $x_z(t)$ shown in FIG. 1b whose shape is uniquely determined by the values of the input sequence at the input sampling instants. Then, $x_z(t)$ is virtually resampled at the desired destination rate using a Sample-and-Hold (S&H) kernel embedded in the virtual A/D converter. The resulting sequence $x_s(k)$ shown in FIG. 1c is subsequently filtered, to remove spectral components outside of the desired frequency range, by a low pass digital interpolation filter, having a bandwidth of the order of the input sampling rate. This filter can be realised using any of the current known techniques for digital filtering. The output sequence $x_f(k)$ is shown in FIG. 1d. These steps are shown schematically in FIG. 2.

The virtual ZOH task depicted in FIG. 1a is realised by holding the value of the last sample at the input rate until a new sample arrives. For the given staircase function $x_z(t)$, the S&H function, i.e. the integral over a sampling period, is computed analytically at each output sampling instant yielding the value of the last received input sample when there has been no input sampling instant since the last output sampling instant, i.e. there is no signal transition in $x_z(t)$. If there has been an input sampling instant since the last output sampling instant, i.e. there has been a signal transition in $x_z(t)$, the S&H function is calculated as a weighted sum of successive input samples before and after the input sampling instant. This involves a very small amount of computation, namely one multiplication and two additions. These computations take place at the input rate.

At each output sampling instant the output value is evaluated analytically as follows:

$$x_s(k) = x(n),$$

if an input sampling instant has not occurred since the last output sampling instant, and $$x_s(k) = (x(n) + d[x(n+1) - x(n)],$$

if an input sampling instant has occurred since the last output sampling instant, where d represents the time elapsed between the transition instant and the following output sampling instant. It will be clear to those skilled in the art that this is a very simple interpolation scheme and that a more complex scheme involving values of the input signal at other input sampling instants, i.e. integration over a larger time interval, could also be used.

Figure 3:
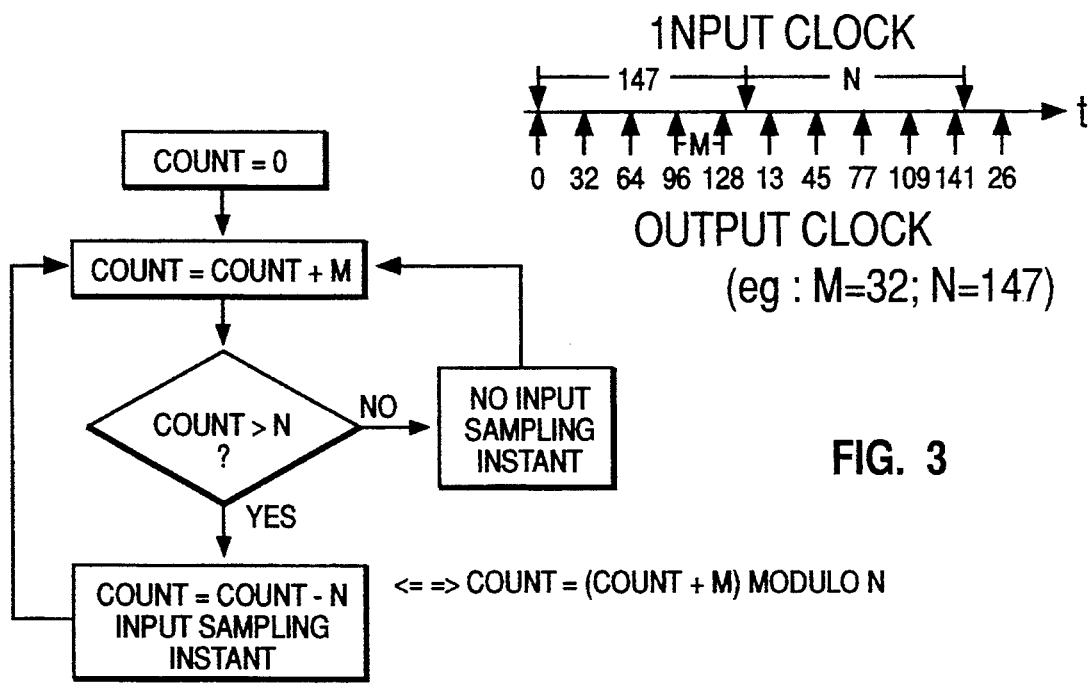
FIG. 3 illustrates the timing method used in the embodiment of the invention.

The timing information is obtained in the following way. If the input rate is iN Hz and the output rate is iM Hz, where i, M and N are integers, i being the highest common factor of the input and output rates, the input rate clock interval can be divided into N time units and then the time between output sampling instants will be precisely M such time units. In the embodiment of the invention a counter is updated at each output sampling instant by an increment M. At any given time, the value of the counter divided by N represents the exact timing of the output sampling instants relative to the most recent input sampling instant. When the counter exceeds N, N is subtracted from its value and an input sampling instant is deemed to have occurred for the purposes of calculating the output value at the next output sampling instant. FIG. 3 is flowchart showing this process. The time elapsed between the transition instant and the next output sampling instant, d is equal to (1 − (Count − N)/M. Since M and N are integers, the counting is done precisely without loss of accuracy.

For example, if the input rate is 9.6 KHz and the output rate is 44.1 KHz then the smallest M can be is M=32 with N=147, the highest common factor of M and N being 300. The output sampling instants will occur with the counter at 0,32,64,96,128, and then after the next input sampling instant with the counter at 13,45,77, and so on. This is also shown in FIG. 3. If the two clocks drift in time then the values of M and/or N can be dynamically adjusted to maintain synchronism of the clocks.

Figure 4:
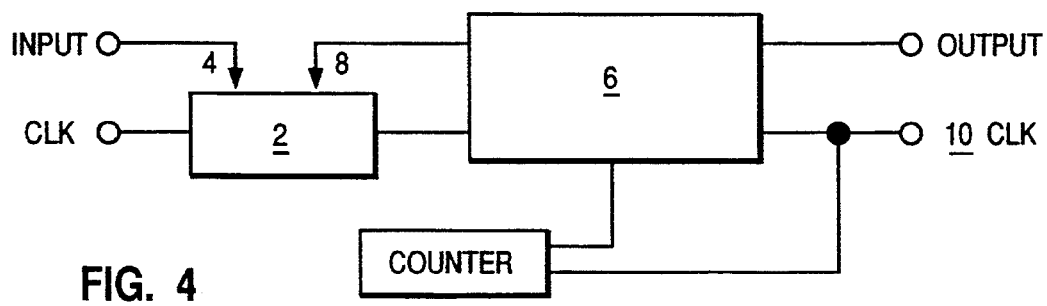
FIG. 4 is a schematic diagram showing a signal processor according to the present invention.

FIG. 4. is a schematic diagram showing a signal processor in this embodiment of the present invention. The input samples are clocked into a wrap-around buffer 2 via a write pointer 4 whose position is incremented on each input clock pulse. These samples are read at every output sampling instant by output sample generator 6 via a read pointer 8. Output samples are generated at the output rate governed by output clock 10. Counter 12 is incremented on every pulse of the output clock 10 by an increment M. The output sample generator 6 determines, using the counter value, whether or not an input sampling instant has occurred since the last output sampling instant and generates the output sample accordingly, as described above. The position of the read pointer 8 is incremented by the output sample generator every time it is determined that an input sampling instant has occurred. Any divergence or convergence between the relative positions in the buffer of the read and write pointers can be tracked and remedied by appropriately adjusting the values of M and N used to increment the counter.

In this embodiment of the invention the signal processor is in the form of a dedicated audio capture and playback adapter for use with a general purpose computer. The adapter operates under the control of a suitable computer program running on the workstation to capture and store, or, alternatively, retrieve from storage and provide to a suitable playback device, data representing an audio signal. However it should be noted that the signal processor of the invention could be implemented as a computer program running on a general purpose computer, or as a dedicated piece of hardware or, indeed, any other combination of hardware and software.

Figure 5:
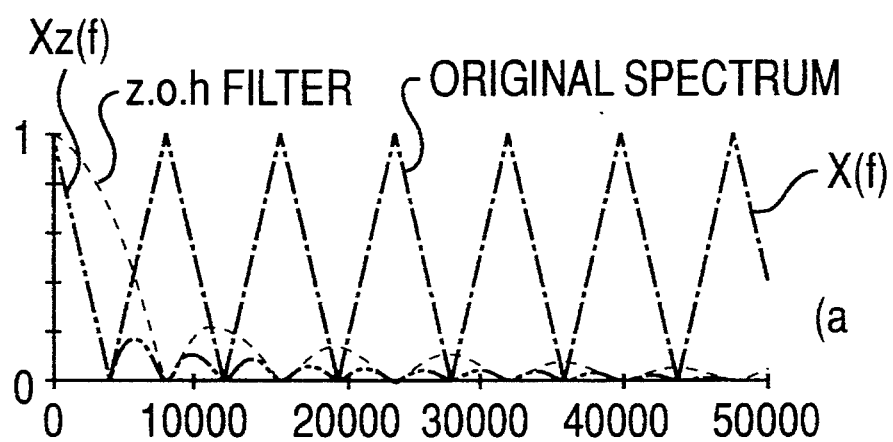
FIG. 5 illustrates, in the frequency domain, the sampling rate conversion process and the various filter envelopes used.
Figure 5:
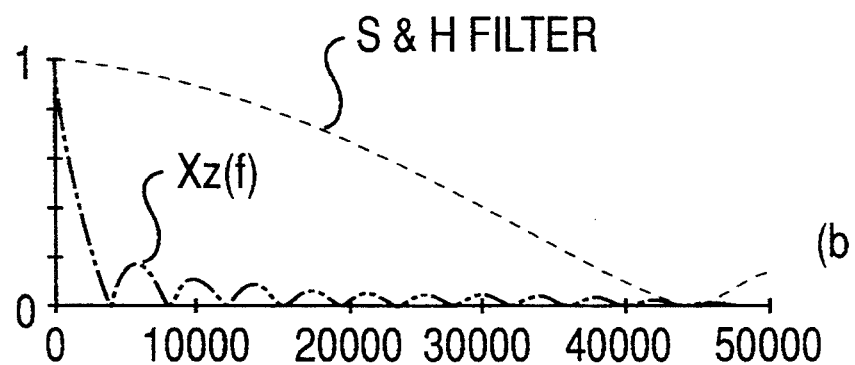
Figure 5:
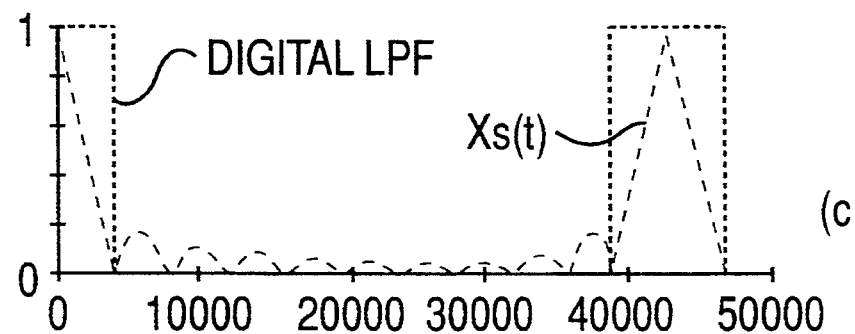

The sampling rate conversion process is shown in the frequency domain in FIG. 5. FIG. 5a shows the original frequency spectrum, the envelope of the ZOH filter and the frequency spectrum of the staircase function $x_z(t)$. FIG. 5b shows the envelope of the S&H filter along with the frequency spectrum of the staircase function $x_z(t)$. The resulting function $X_s(f)$ is shown in FIG. 5c, along with the filter envelope of the final digital filter stage.

The frequency analysis shown in FIG. 5 indicates that the combined response of the D/A-A/D section is characterised by its rather flat response inside the base-band, especially at the low frequency end, and by a broad bandwidth outside the base-band. Note that the combined frequency response around multiples of the destination frequency has a very low value.

Figure 6:
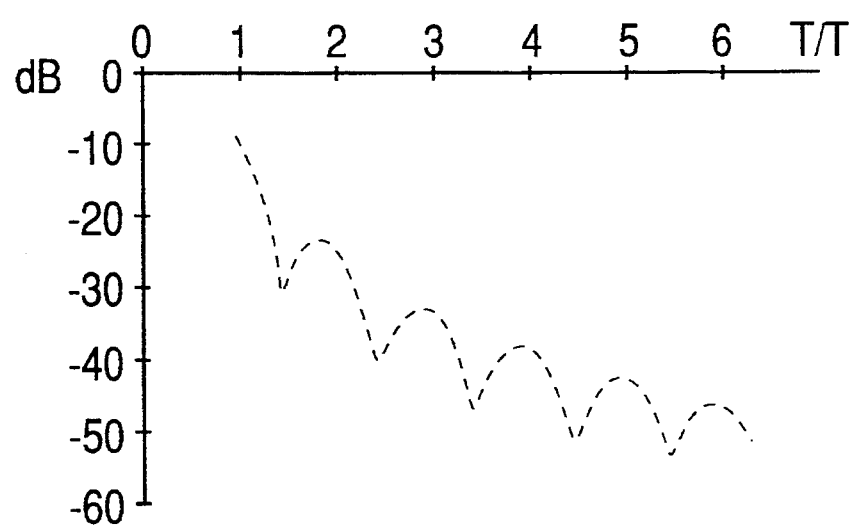
FIG. 6 is a graph showing the maximum intensity of aliased frequencies in the base band vs the ratio of the sampling rates.

The scheme described above works best if the destination frequency is of the order of several times the source frequency. If this condition is not met best results can be obtained by selecting an intermediate frequency which is a large (x5–10) integer multiple of the final destination frequency, converting the sampling rate to this frequency using the above scheme and using a simple digital division to convert the rate back down to the desired rate. This way the S&H function will guarantee that only negligible energy will alias into the base-band of interest. The maximum amplitude of the aliased frequencies is given in FIG. 6, which shows the alias amplitude when converting 8 KHz samples to the 44.1 KHz CD rate. As long as the intermediate rate conversion ratio is above 4, the aliased frequency amplitude is bounded by −40 dB at most.

Although the present invention has been fully described above with reference to specific embodiments, other alternative embodiments will be apparent to those of ordinary skill in the art. Therefore, the above description should not be taken as limiting the scope of the present invention which is defined by the appended claims.

What is claimed is:

1. A signal processor comprising:
   means for receiving a first digital signal and producing an analog signal therefrom;
   means for generating digital sample values from the analog signal wherein selected sample digital values are interpolated with other digital sample values generated from the analog signal; and
   means for filtering, subsequent to said means for generating, said interpolated selected sample digital values.

2. The signal processor of claim 1 further comprising means for storing a count of generated digital sample values.

3. The signal processor of claim 2 further comprising means for selecting which digital sample values are to be interpolated when the count exceeds a predetermined value.

4. The signal processor of claim 3 further comprising a digital filter for filtering the digital sample values.

5. The signal processor of claim 4 wherein the means for receiving and producing includes a zero-order-hold kernel.

6. A method of signal processing comprising the step of:
   receiving a first digital signal and producing an analog signal therefrom;
   generating digital sample values from the analog signal wherein selected sample digital values are interpolated with other digital sample values generated from the analog signal; and
   filtering, subsequent to said step of generating, said interpolated selected sample digital values.

7. The method of claim 6 further comprising a step of storing a count of generated digital sample values.

8. The method of claim 7 further comprising a step of selecting which digital sample values are to be interpolated when the count exceeds a predetermined value.

9. The method of claim 8 further comprising a step of digitally filtering the digital sample values.

10. The method of claim 9 wherein the step of receiving and producing includes a utilizing zero-order-hold kernel.

11. A computer program product stored on a computer readable medium executable on a processor for signal processing comprising:
    means for receiving a first digital signal and producing an analog signal therefrom;
    means for generating digital sample values from the analog signal wherein selected sample digital values are interpolated with other digital sample values generated from the analog signal; and
    means for filtering, subsequent to said means for generating, said interpolated selected sample digital values.

12. The computer program product of claim 11 further comprising means for storing a count of generated digital sample values.

13. The computer program product of claim 12 further comprising means for selecting which digital sample values are to be interpolated when the count exceeds a predetermined value.

14. The computer program product of claim 13 further comprising a digital filter for filtering the digital sample values.

15. The computer program product of claim 14 wherein the means for receiving and producing includes a zero-order-hold kernel.

16. A signal processor for converting a first digital signal to a second digital signal, the signal processor comprising:
    a) means for receiving a first digital signal having a first sequence of digital values corresponding to a first sequence of time instants and producing an analog signal therefrom;
    b) means for generating a plurality of sample values from the generated analog signal at each of a second sequence of time instants;
    c) means for generating the second digital signal having a second sequence of digital values corresponding to the second sequence of time instants from the sampled analog signal, each second digital signal value being equal to a sample value if the sample value is approximately equal to a previous sample value, else the second digital signal value being equal to an interpolation of a plurality of sample values; and
    d) means for filtering, subsequent to said means for generating, said interpolated selected sample digital values.

17. The signal processor of claim 16 further comprising means for storing a count of second time instants.

18. The signal processor of claim 17 further comprising means for selecting second digital signal values to be interpolated when the count exceeds a predetermined value.

19. The signal processor of claim 18 further comprising a digital filter for filtering the second digital signal.

20. The signal processor of claim 19 wherein the means for producing an analog signal includes a zero-order-hold kernel.

* * * * *